(12) United States Patent
Youssef et al.

(10) Patent No.: US 9,559,640 B2
(45) Date of Patent: Jan. 31, 2017

(54) ELECTROSTATIC DISCHARGE PROTECTION FOR CMOS AMPLIFIER

(71) Applicant: QUALCOMM Incorporated, San Diego, CA (US)

(72) Inventors: Ahmed Abdel Monem Youssef, San Diego, CA (US); Prasad Srinivasa Siva Gudem, San Diego, CA (US); Eugene Robert Worley, Irvine, CA (US); Dongling Pan, San Diego, CA (US); Li-Chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/632,646

(22) Filed: Feb. 26, 2015

(65) Prior Publication Data
US 2016/0254789 A1   Sep. 1, 2016

(51) Int. Cl.
  *H03F 1/52* (2006.01)
  *H03F 3/193* (2006.01)
  *H03F 3/21* (2006.01)
(52) U.S. Cl.
  CPC .............. *H03F 1/523* (2013.01); *H03F 3/193* (2013.01); *H03F 3/211* (2013.01); *H03F 2200/294* (2013.01); *H03F 2200/441* (2013.01); *H03F 2200/444* (2013.01); *H03F 2200/451* (2013.01); *H03F 2200/489* (2013.01); *H03F 2203/21106* (2013.01)
(58) Field of Classification Search
  CPC ........................................................ H03F 1/52
  USPC .............................. 330/298, 207 P, 264, 267
  See application file for complete search history.

(56) References Cited

U.S. PATENT DOCUMENTS

| | | | |
|---|---|---|---|
| 4,250,463 A * | 2/1981 | Foster | H03F 1/22 330/298 |
| 5,740,000 A | 4/1998 | Stackhouse et al. | |
| 7,242,253 B2 * | 7/2007 | Motta | H03F 1/22 330/311 |
| 7,649,722 B2 * | 1/2010 | Thijs | H03F 1/223 361/56 |
| 8,000,068 B2 | 8/2011 | Brown, Jr. et al. | |
| 8,213,142 B2 | 7/2012 | Worley | |
| 8,482,071 B2 | 7/2013 | Russ et al. | |
| 8,482,888 B2 * | 7/2013 | Tsai | H02H 9/045 361/56 |
| 2010/0200920 A1 | 8/2010 | Su et al. | |
| 2011/0102081 A1 | 5/2011 | Su et al. | |
| 2012/0176720 A1 | 7/2012 | Tsai | |

(Continued)

OTHER PUBLICATIONS

International Search Report and Written Opinion—PCT/US2016/015235—ISA/EPO—Jun. 16, 2016.

*Primary Examiner* — Henry Choe
(74) *Attorney, Agent, or Firm* — Paradice and Li LLP

(57) ABSTRACT

A CMOS amplifier including electrostatic discharge (ESD) protection circuits is disclosed. In one embodiment, the CMOS amplifier may include a PMOS transistor, a NMOS transistor, primary protection diodes, and one or more auxiliary protection diodes to limit a voltage difference between terminals of the CMOS amplifier. In some embodiments, the auxiliary protection diodes may limit the voltage difference between an input terminal of the CMOS amplifier and a supply voltage, the input terminal of the CMOS amplifier and ground, and the input terminal and the output terminal of the CMOS amplifier.

19 Claims, 5 Drawing Sheets

(56) References Cited

U.S. PATENT DOCUMENTS

2014/0217511 A1 8/2014 Katakura et al.
2014/0268447 A1 9/2014 Gudem et al.

* cited by examiner

US 9,559,640 B2

ELECTROSTATIC DISCHARGE PROTECTION FOR CMOS AMPLIFIER

TECHNICAL FIELD

The exemplary embodiments relate generally to amplifiers, and specifically to providing electrostatic discharge protection to a complementary metal oxide silicon (CMOS) amplifier.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

The wireless device may include one or more amplifiers to process analog signals. For example, some amplifiers may provide a processing gain (e.g., voltage and/or current gain) for relatively low amplitude signals, isolation for relatively sensitive signals, increased current for driving signals into transmission lines, and signal amplification for transmitting signals through a communication medium.

Some amplifiers may be exposed to environments that allow relatively high voltages to be undesirably coupled to one or more terminals of the amplifier. For example, an electrostatic discharge (ESD) event may expose relatively high voltages to the amplifier. If not protected, the amplifier may be damaged by the relatively high voltages. For example, a high voltage may cause a PN junction failure or an oxide failure and thereby damage one or more transistors included in the amplifier. Also, as device geometries (e.g., feature size) of the devices within the amplifier shrink, the devices within the amplifier become susceptible to damage with lower voltages. For example, a rapture voltage (e.g., voltage needed to damage a PN junction) associated with a metal oxide semiconductor (MOS) transistor may decrease as feature sizes decrease.

Thus, there is a need to improve ESD protection for amplifiers.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all embodiments defined by the appended claims.

In addition, the detailed description set forth below in connection with the appended drawings is intended as a description of exemplary embodiments of the present disclosure and is not intended to represent the only embodiments in which the present disclosure may be practiced. The term "exemplary" used throughout this description means "serving as an example, instance, or illustration," and should not necessarily be construed as preferred or advantageous over other embodiments.

Figure 1:
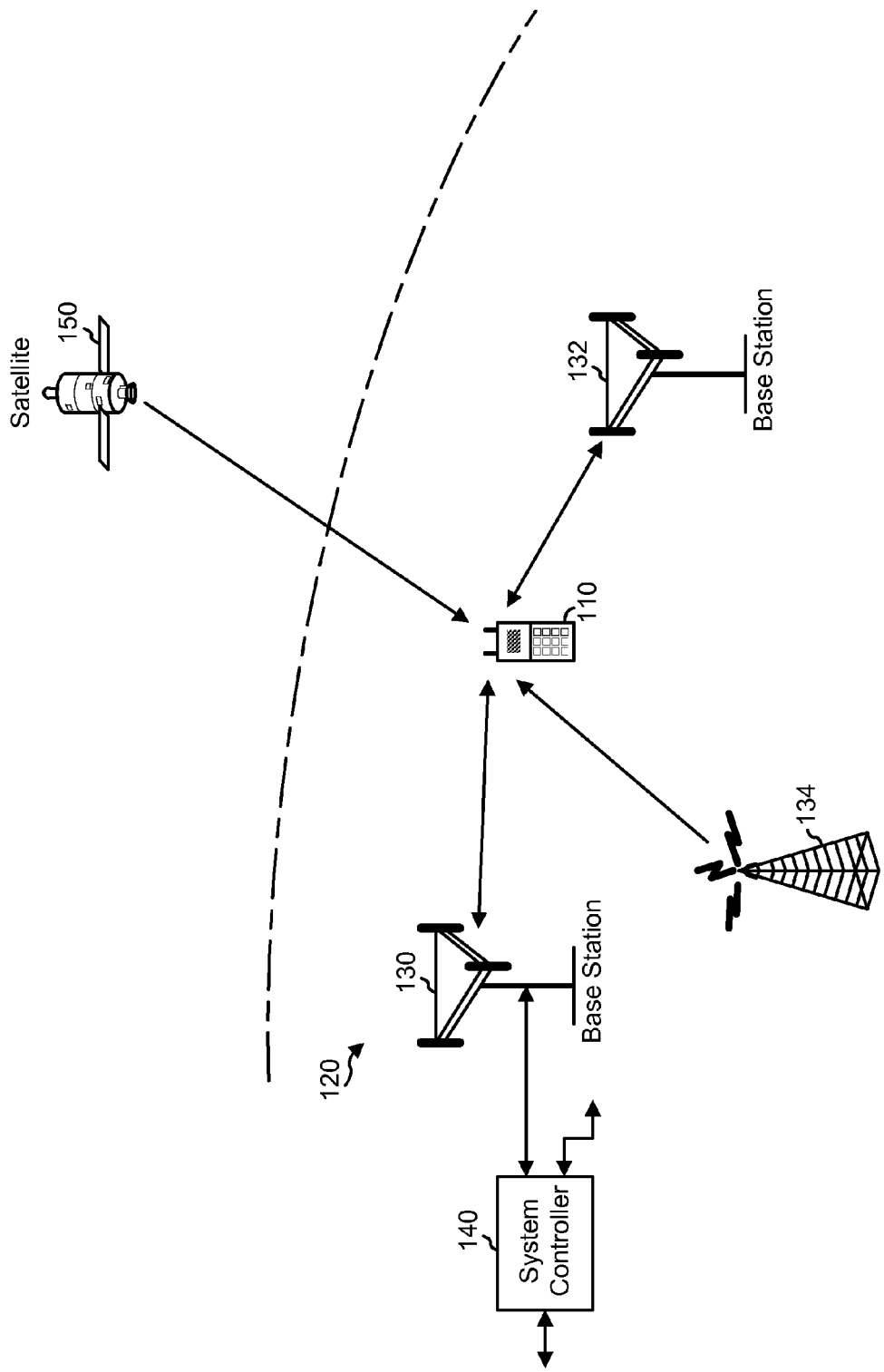
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Figure 2:
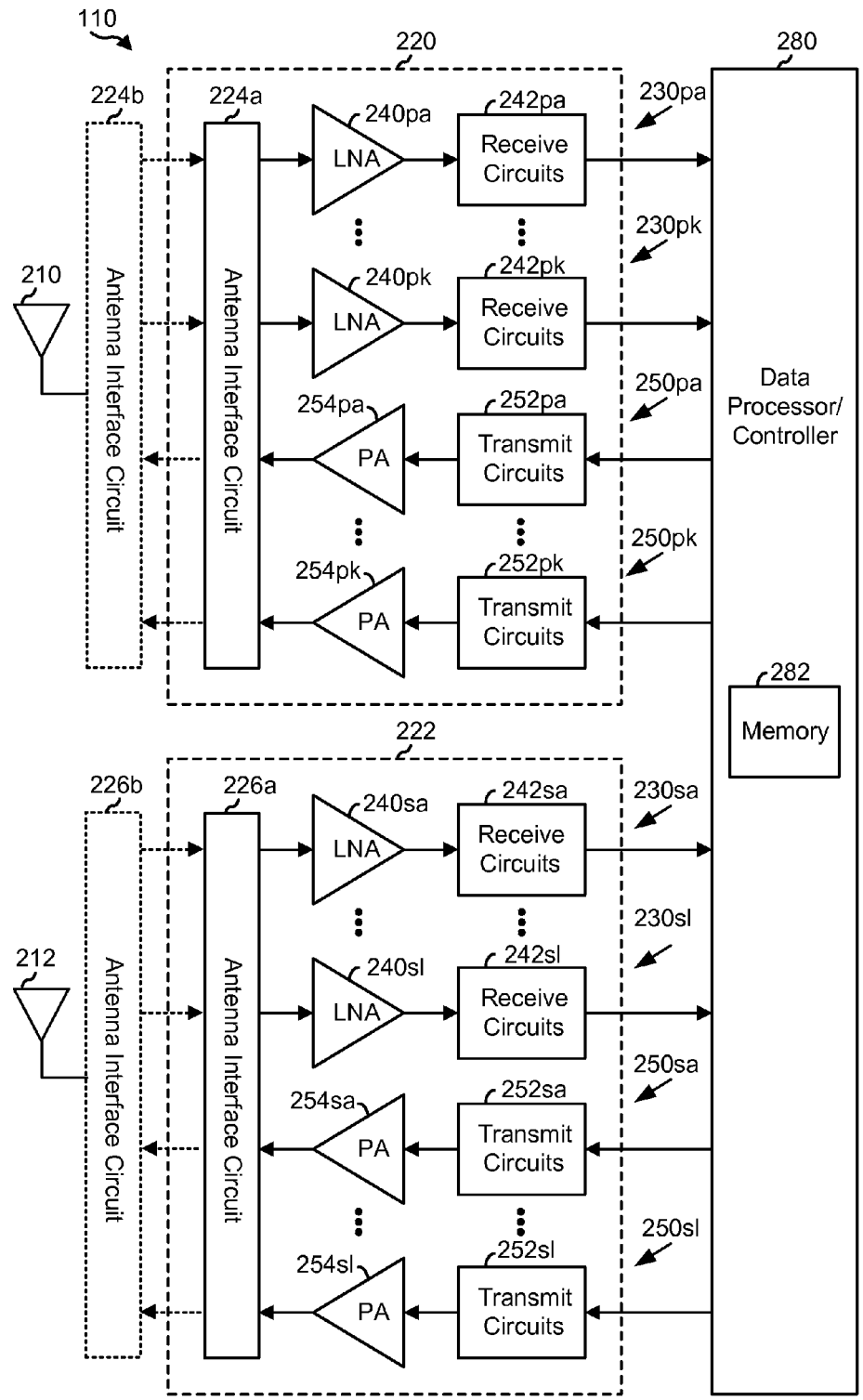
FIG. 2 shows a block diagram of an exemplary design of the wireless device in FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 (e.g., 230pa-230pk and 230sa-230sl) includes a low noise amplifier (LNA) 240 (e.g., 240pa-240pk and 240sa-240sl) and receive circuits 242 (e.g., 242pa-242pk and 242sa-242sl). For data reception, primary antenna 210 receives signals from base stations and/or other transmitter stations and provides a received radio frequency (RF) signal, which is routed through an antenna interface circuit 224a and presented as an input RF signal to a selected receiver. Antenna interface circuit 224a may include switches, duplexers, transmit filters, receive filters, matching circuits, etc. In some embodiments, antenna interface circuit 224b (shown with dotted lines) may be external to primary transceiver 220. Thus, LNA 240 and/or power amplifier (PA) 254 may have inputs and outputs accessible from outside primary transceiver 220. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in primary transceivers 220 may operate in similar manner as receiver 230pa. Receivers 230 and associated antenna interface circuit 226a (or 226b) within secondary transceiver 222 may operate in a similar manner as receiver 230pa.

In the exemplary design shown in FIG. 2, each transmitter 250 (e.g., 250pa-250pk and 250sa-250sl) includes transmit circuits 252 (e.g., 252pa-252pk and 252sa-252sl) and a power amplifier (PA) 254 (e.g., 254pa-254pk and 254sa-254sl). For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224a (or antenna interface circuit 224b) and transmitted via primary antenna 210. Each remaining transmitter 250 in primary transceiver 220 may operate in similar manner as transmitter 250pa. Transmitters 250 and associated antenna interface circuit 226a (or 226b) within secondary transceiver 222 may operate in a similar manner as receiver 230pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
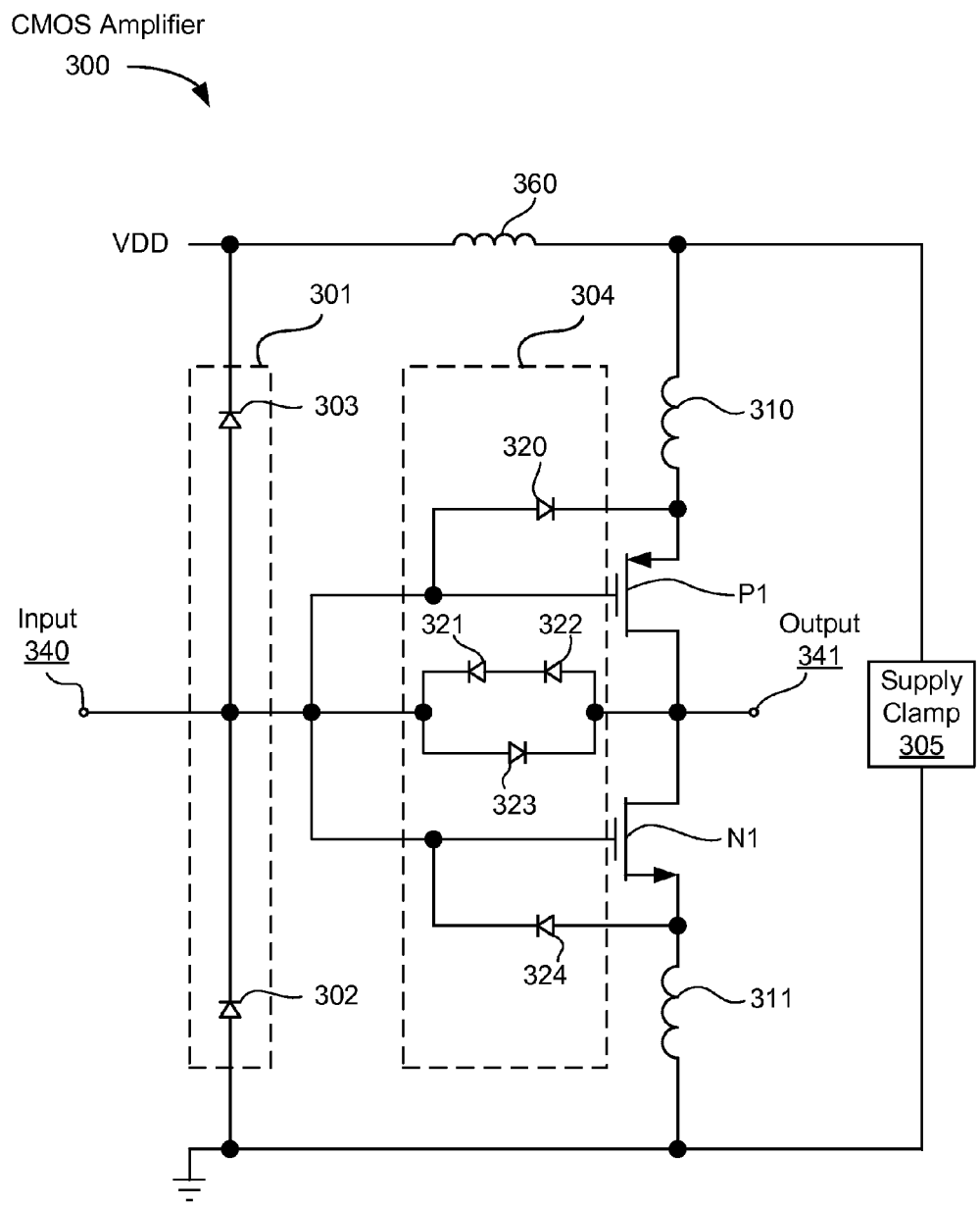
FIG. 3 depicts an exemplary embodiment of a CMOS amplifier, in accordance with some embodiments.

FIG. 3 depicts an exemplary embodiment of a CMOS amplifier 300, in accordance with some embodiments. In some embodiments, CMOS amplifier 300 may be included within LNA 240, receive circuits 242, PA 254, and/or transmit circuits 252 as described above. CMOS amplifier 300 may amplify signals within wireless device 110, such as modulated RF signals that may be transmitted and/or received. As shown, CMOS amplifier 300 includes transistor P1, transistor N1, a first degeneration inductor 310, a second degeneration inductor 311, primary protection circuit 301 including protection diodes 302-303, auxiliary protection circuit 304 including protection diodes 320-324, and a supply clamp 305. In some embodiments, transistor P1 may be a PMOS transistor and transistor N1 may be a NMOS transistor. CMOS amplifier 300 may also include an input terminal 340 and an output terminal 341.

Transistor P1 and transistor N1 may be coupled together to form an inverting amplifier for CMOS amplifier 300. For example, a gate terminal of transistor P1 may be coupled to a gate terminal of transistor N1, and may form an input terminal for the inverting amplifier (and input terminal 340 for CMOS amplifier 300). A source terminal of transistor P1 may be coupled to a supply voltage, such as VDD. A source terminal of transistor N1 may be coupled to ground. A drain terminal of transistor P1 may be coupled to a drain terminal of transistor N1 and may form an output terminal for the inverting amplifier (and output terminal 341 for CMOS amplifier 300).

In some embodiments, degeneration inductors 310 and 311 may be coupled to transistor P1 and transistor N1 to, among other things, reduce a dependence of CMOS amplifier 300 on an absolute gain of transistor P1 and/or transistor N1. For example, the absolute gain provided by transistor P1 and/or transistor N1 may be reduced by the degeneration inductors 310 and 311 in exchange for providing a more predictable (albeit lower) gain for CMOS amplifier 300. In some other embodiments, degeneration inductors 310 and 311 may improve a linearity associated with CMOS amplifier 300. Thus an output signal provided by CMOS amplifier 300 may be made more proportional to an input signal provided to CMOS amplifier by degeneration inductor 310 and/or degeneration inductor 311. In some embodiments, the first degeneration inductor 310 may couple the source terminal of transistor P1 to the supply voltage, and the second degeneration inductor 311 may couple the source terminal of transistor N1 to ground.

CMOS amplifier 300 may be protected from some ESD events by primary protection circuit 301, supply clamp 305, and auxiliary protection circuit 304. An ESD event may occur when static electricity is received though one or more terminals of CMOS amplifier 300. The voltage associated with the ESD event may be sufficient to damage transistor P1 and/or transistor N1. In some embodiments (e.g., transistors realized using nanometer CMOS technology), a voltage as low as five volts may be sufficient to damage a transistor (e.g., transistor P1 and/or transistor N1). Voltages associated with ESD events may be 125 volts or higher. Primary protection circuit 301, supply clamp 305, and/or auxiliary protection circuit 304 may prevent transistor P1 and/or transistor N1 from exposure to high voltages related to ESD events.

Primary protection circuit 301 may provide a discharge path when relatively high voltages are received through ground (e.g., via a ground terminal, not shown for simplicity) or through input terminal 340. Primary protection circuit 301 may include protection diode 302 and protection diode 303. In some embodiments, receiving a high voltage may be referred to as a capacitive discharge model (CDM) event. For example, when the received high voltage is positive with respect to ground, then the high voltage may be referred to as a negative CDM event. In a similar manner, when the received high voltage is negative with respect to ground, then the high voltage may be referred to as a positive CDM event.

In one embodiment, if a high positive voltage is received at input terminal 340 (e.g., a negative CDM event), then protection diode 303 may operate (e.g., be forward biased) and conduct the high positive voltage from input terminal 340, to a supply voltage terminal (e.g., VDD), through supply clamp 305, and to ground. In some embodiments, the voltage supply terminal may be floating and may not provide a discharge current path. Operation of supply clamp 305 is described in more detail below. Thus, when the voltage received at input terminal 340 is greater than or equal to a forward voltage associated with protection diode 303, then protection diode 303 may conduct the voltage at input terminal 340 to ground. In another embodiment, if a high negative voltage (e.g., a positive CDM event) is received at input terminal 340, then protection diode 302 may operate and conduct the high negative voltage through input terminal 340. In some embodiments, the forward voltage associated with protection diode 302 and/or protection diode 303 may operate as a threshold voltage for the discharge path provided by primary protection circuit 301. When a voltage exceeds the threshold voltage, protection diode 302 and/or protection diode 303 may provide the discharge path. For example, if a high positive voltage is received at the ground terminal (e.g., a positive CDM event), then protection diode 302 may operate and conduct the high voltage through input terminal 340. In this case, the voltage at the ground terminal may be greater than the forward voltage associated with protection diode 302.

Supply clamp 305 may operate as a clamp circuit and provide a discharge path when a relatively high voltage is received at the supply voltage terminal. In some embodiments, supply clamp 305 may include a transistor, such as a NMOS transistor (not shown for simplicity), configured to conduct (e.g., turn on) when a voltage at the power supply terminal exceeds a threshold voltage. For example, supply clamp 305 may sense a voltage level at the supply voltage terminal. When the voltage level exceeds the threshold voltage, the supply clamp 305 may turn on and conduct voltage from the supply voltage terminal to the ground terminal. In some embodiments, under normal operating conditions, the threshold voltage may be high enough to allow normal operation, but low enough to prevent transistor damage resulting from an undesirable application of a relatively high voltage to CMOS amplifier 300. For example, if a normal operating voltage of CMOS amplifier 300 is 3.3 volts, then supply clamp 305 may be configured to turn on when the voltage at the supply voltage terminal meets or exceeds 4 volts.

Auxiliary protection circuit 304 may protect selected junctions of transistor P1 and transistor N1 from relatively high voltage levels due to ESD events. In some embodiments, auxiliary protection circuit 304 may offer additional ESD protection when used in conjunction with primary protection circuit 301 and supply clamp 305. In some embodiments, the additional ESD protection may improve ESD performance in circuits having one or more parasitic inductors and/or resistors. Auxiliary protection circuit 304 may include protection diodes 320-324. In one embodiment, protection diode 320 may protect transistor P1 by limiting a voltage difference between the gate terminal and the source terminal of transistor P1. For example, protection diode 320 may limit the voltage difference between the source terminal and the gate terminal of transistor P1 to no more than a forward voltage associated with protection diode 320. Thus, if a high positive voltage from an ESD event is received at input terminal 340 (e.g., a negative CDM event when voltage at input terminal 340 is at a higher voltage potential than the supply voltage terminal), then protection diode 320 may ensure that the voltage difference between the gate terminal and the source terminal of transistor P1 is limited to the forward voltage associated with protection diode 320. In this manner, protection diode 320 may protect a gate/source junction of transistor P1.

In one embodiment, protection diodes 321-323 may protect transistor P1 and/or transistor N1 by limiting a voltage difference between the gate terminal and the common-coupled drain terminals of transistor P1 and transistor N1. If a high positive voltage is received at input terminal 340 (e.g., a negative CDM event when output terminal 341 is at a lower voltage potential than input terminal 340), then protection diode 323 may limit the voltage difference between the gate terminals of transistor P1 and transistor N1 and drain terminals of transistor P1 and transistor N1. Thus, if a high positive voltage from an ESD event is received at input terminal 340, then protection diode 323 may ensure that the voltage difference between the gate terminal and the drain terminals of transistors P1 and N1 are limited to a forward voltage associated with protection diode 323. In some embodiments, protection diode 323 may ensure that the voltage difference between the gate terminal and the source terminal of transistor N1 may be limited to the forward voltage associated with protection diode 323.

In a similar manner, protection diodes 321-322 may also protect transistor P1 and/or transistor N1. For example, if a high negative voltage is received at output terminal 341 (e.g., a positive CDM event when output terminal 341 is at a higher voltage potential than input terminal 340), then protection diodes 321-322 may limit the voltage difference between the gate terminals of transistor P1 and transistor N1 and the common-coupled drain terminals of transistor P1 and transistor N1. In some embodiments, protection diodes 321-322 may be coupled serially between input terminal 340 and output terminal 341, as shown. Thus, the voltage difference between output terminal 341 and input terminal 340 may be limited to a voltage sum based on a forward voltage associated with protection diode 321 and a forward voltage associated with protection diode 322. In this manner, protection diodes 321-323 may protect a gate/drain junction of transistor P1 and transistor N1. In other embodiments, protection diodes 321-323 may protect a gate/source junction of transistor P1. In some embodiments, input terminal 340 may be coupled to gate terminals of transistor P1 and transistor N1. Similarly, output terminal 341 may be coupled to drain terminals of transistor P1 and transistor N1. Thus, protection diodes 321-323 may also limit the voltage difference between input terminal 340 and output terminal 341.

In some embodiments, protection diode 324 may protect transistor N1 by limiting a voltage difference between the gate terminal and the source terminal of transistor N1. For example, protection diode 324 may protect transistor N1 by limiting a voltage difference between the gate terminal and the source terminal of transistor N1 to no more than a forward voltage associated with protection diode 324. Thus, if a high positive voltage from an ESD event is received through the ground terminal (e.g., a positive CDM event), then protection diode 324 may ensure that the voltage difference between the gate terminal and the source terminal of transistor N1 is limited to the forward voltage associated with protection diode 324. In this manner, protection diode 324 may protect a gate/source junction of transistor N1.

In some embodiments, auxiliary diodes 304 may also protect transistors P1 and N1 from voltages that may be induced across parasitic inductors that may be included within CMOS amplifier 300. For example, CMOS amplifier 300 may include parasitic inductor 360. Although only one parasitic inductor 360 is shown, those having ordinary skill in the art will recognize that additional parasitic inductors may be included within other circuit branches of CMOS amplifier 300. If a relatively large voltage associated with an ESD event is coupled to input terminal 340, then a relatively large voltage may be induced across parasitic inductor 360 in response to the rapid change in current flow resulting from the ESD event. Since the time associated with ESD events may be quite small, the induced voltage across parasitic inductor may be large (e.g., $$V = L\frac{di}{dt}\bigg).$$

In some embodiments, the voltage induced across parasitic inductor 360 may cause potentially damaging voltages between the gate terminal and the source terminal of transistor N1 and between the gate terminal and the source terminal of transistor P1. In some cases, auxiliary diodes 304 may limit the amplitude of voltages between terminals of transistor P1 and N1, including voltages caused by one or more parasitic inductors within CMOS amplifier 300.

Figure 4:
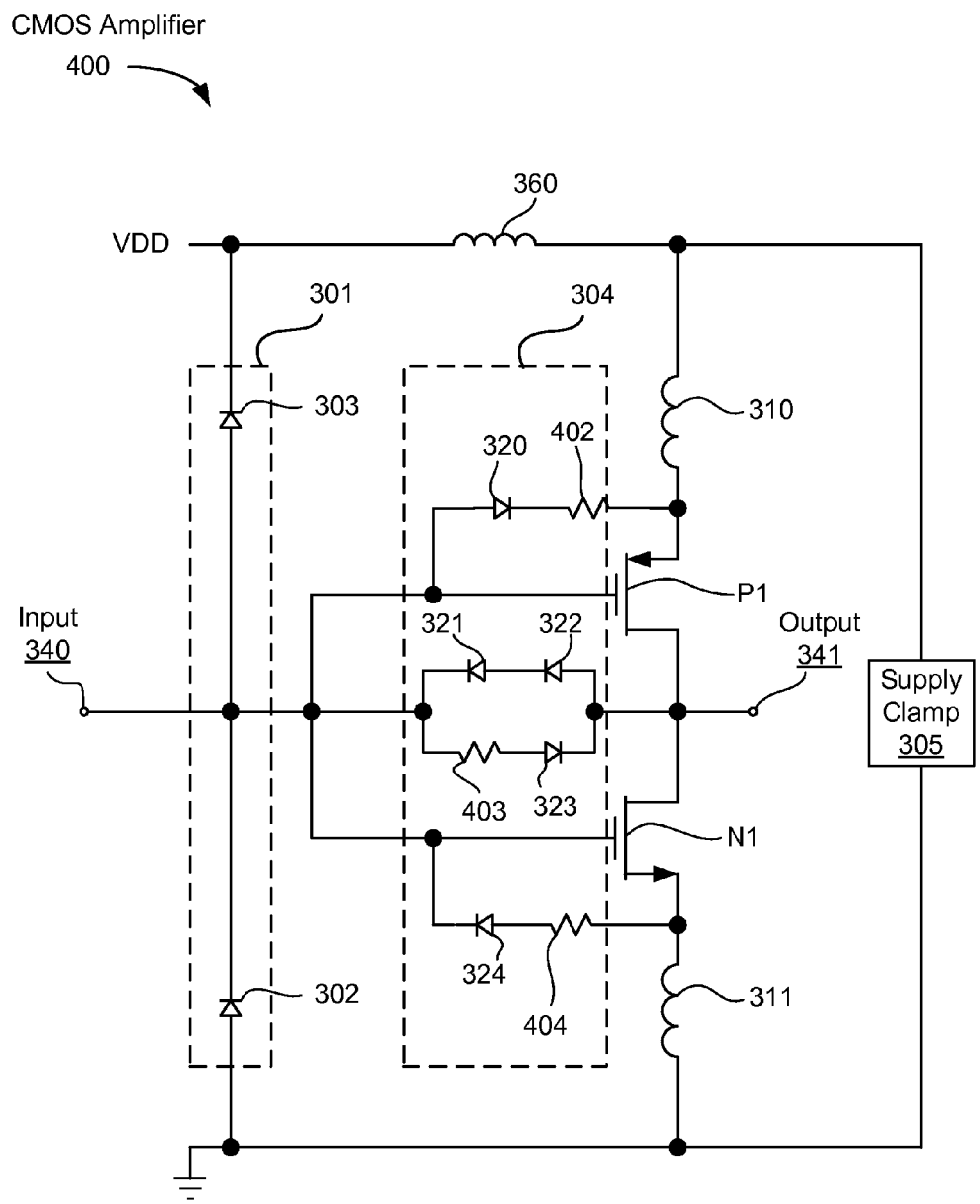
FIG. 4 depicts another exemplary embodiment of a CMOS amplifier, in accordance with some embodiments

FIG. 4 depicts another exemplary embodiment of a CMOS amplifier 400, in accordance with some embodiments. CMOS amplifier 400 may be similar to CMOS amplifier 300, but may include one or more additional elements. For example, CMOS amplifier 400 may include transistor P1, transistor N1, first degeneration inductor 310, second degeneration inductor 311, primary protection circuit 301, auxiliary protection circuit 304, and supply clamp 305 in common with CMOS amplifier 300. In addition, CMOS amplifier 400 may include one or more resistors 402-404 in series with one or more protection diodes. In one embodiment, resistor 402 may be coupled in series with protection diode 320, resistor 403 may be coupled in series with protection diode 323, and resistor 404 may be coupled in series with protection diode 324. In some embodiments, other numbers of resistors may be included with protection diodes 320-324 and/or protection diodes 302 and 303. For example, a resistor may be series coupled with protection diode 321 and/or a second resistor may be coupled with one of resistors 402-404 (not shown for simplicity). In still other embodiments, one or more of resistors 402-404 may be omitted.

Resistors 402-404 may enable an additional voltage to be dissipated in conjunction with an associated protection diode. For example, protection diode 320 and resistor 402 may limit the voltage difference between the gate terminal and the source terminal of transistor P1 to the forward voltage associated with protection diode 320 and an associated voltage across resistor 402. In a similar manner, resistor 403 and protection diode 323 may limit the voltage difference between the gate terminals and the drain terminals of transistors P1 and N1, and resistor 404 and protection diode 324 may limit the voltage difference between the source terminal and the gate terminal of the N1 transistor. In some embodiments, resistance values for resistors 402-404 may range from 1 to 5 ohms, although other suitable resistance values may be used.

Figure 5:
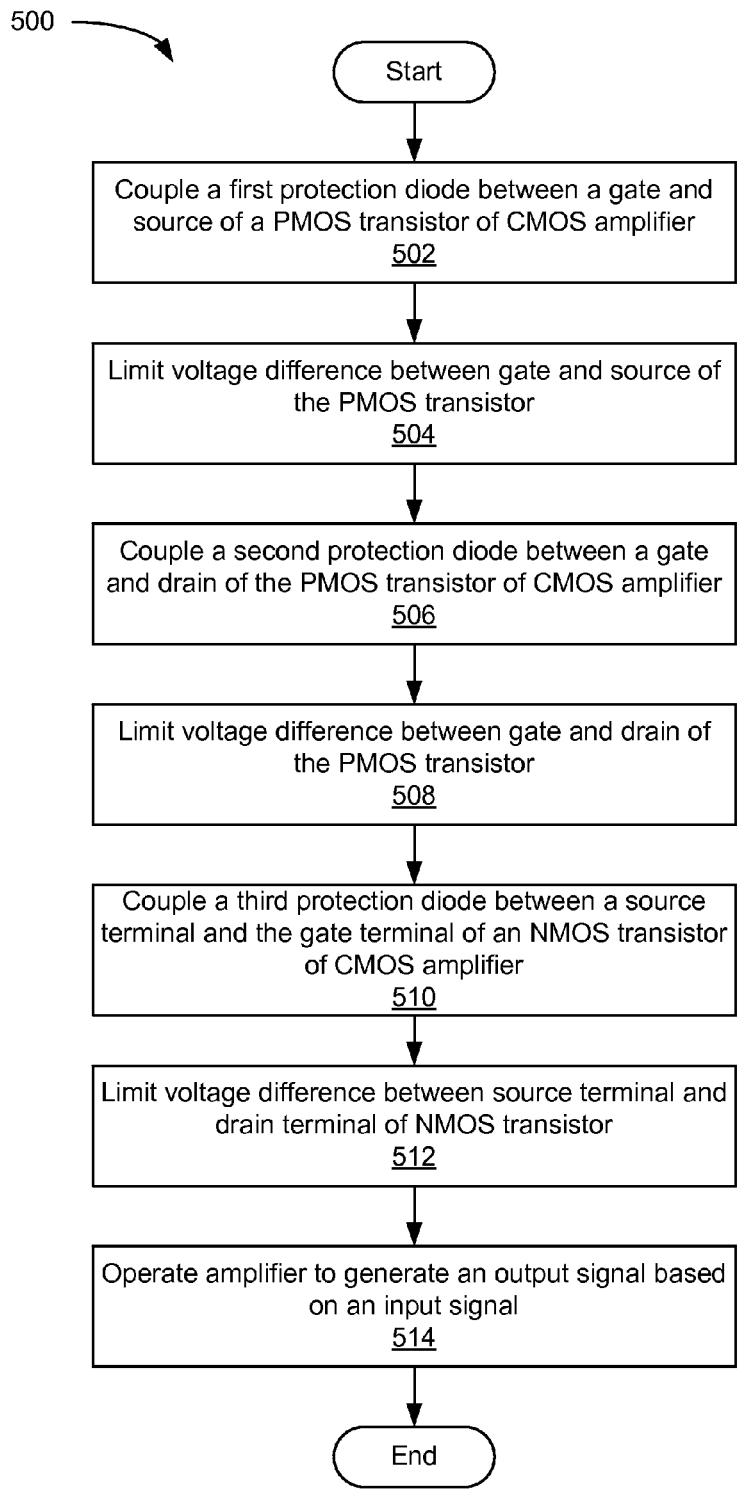
FIG. 5 shows an illustrative flow chart depicting an exemplary operation for protecting a CMOS amplifier, in accordance with some embodiments.

FIG. 5 shows an illustrative flow chart depicting an exemplary operation 500 for protecting a CMOS amplifier, in accordance with some embodiments. Some embodiments may perform the operations described herein with additional operations, fewer operations, operations in a different order, operations in parallel, and/or some operations differently. Referring also to FIGS. 2 and 3, a first protection diode is coupled between the gate terminal and the source terminal of a PMOS transistor P1 of CMOS amplifier 300 (502). In some embodiments, the first protection diode may include protection diode 320 (see FIG. 3). Next, a voltage difference between the gate terminal and the source terminal of transistor P1 is limited (504). In some embodiments, the voltage difference may be limited to a forward voltage associated with the first protection diode. In other embodiments, the first protection diode may limit a voltage difference between an input of CMOS amplifier 300 and a supply voltage, for example, when the gate terminal of the transistor P1 is coupled to the input terminal of CMOS amplifier 300, and a source terminal of transistor P1 is coupled to the supply voltage. In some embodiments, a degeneration inductor 310 may be coupled between the source terminal of transistor P1 and the supply voltage. The degeneration inductor 310 may reduce a dependence of CMOS amplifier 300 on the absolute gain of transistor P1.

Next, a second protection diode is coupled between the gate terminal and a drain terminal of transistor P1 (506). In some embodiments, the second protection diode may include protection diode 323 (see FIG. 3). In other embodiments, the second protection diode may include protection diodes 321 and 322. In still other embodiments, the second protection diode may include protection diodes 321-323. Next, a voltage difference between the gate terminal and the drain terminal of the transistor P1 is limited (508).

In some embodiments, a voltage difference between an input terminal and an output terminal of CMOS amplifier 300 may also be limited. For example, when input terminal 340 of the CMOS amplifier 300 is coupled to the gate terminal of transistor P1, and output terminal 341 of CMOS amplifier 300 is coupled to the drain terminal of transistor P1, then the voltage difference between input terminal 340 and output terminal 341 of CMOS amplifier 300 may be limited.

Next, a third protection diode is coupled between the source terminal and the gate terminal of an NMOS transistor N1 of CMOS amplifier 300 (510). In one embodiment, the third protection diode may include protection diode 324. Next, a voltage difference between the source terminal and the gate terminal of the transistor N1 is limited (512). In some embodiments, the voltage difference may be limited to a forward voltage associated with the third protection diode. In other embodiments, the third protection diode may limit a voltage difference between ground and input terminal 340 of CMOS amplifier 300, for example, when the gate terminal of the transistor N1 is coupled to input terminal 340, and a source terminal of transistor N1 is coupled to ground. In some embodiments, a degeneration inductor 311 may be coupled between the source terminal of the transistor N1 and ground. The degeneration inductor 311 may reduce a dependence of CMOS amplifier 300 on the absolute gain of transistor N1.

Next, an output signal is generated by CMOS amplifier 300 based on an input signal (514). For example, an input signal may be received at an input terminal 340 of CMOS amplifier 300. The input signal may be amplified by transistor P1 and/or transistor N1. Transistor P1 and/or transistor N1 may generate the output signal for the CMOS amplifier 300 via output terminal 341.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus comprising:
a PMOS transistor configured to amplify an input signal and to generate an output signal of an amplifier;
a degeneration inductor configured to reduce a gain of the amplifier;
a first protection diode configured to limit a voltage difference between an input terminal of the amplifier and a supply voltage, wherein the first protection diode is directly coupled between a source terminal of the PMOS transistor and a gate terminal of the PMOS transistor; and
one or more second protection diodes, directly coupled between the gate terminal and a drain terminal of the PMOS transistor, and configured to limit a voltage difference between the input terminal of the amplifier and an output terminal of the amplifier.

2. The apparatus of claim 1, wherein the first protection diode is further configured to limit a voltage difference between a gate terminal and a source terminal of the PMOS transistor.

3. The apparatus of claim 1, wherein the first protection diode is further configured to protect a gate/source junction of the PMOS transistor.

4. The apparatus of claim 1, further comprising:
a first resistor coupled in series with the first protection diode.

5. The apparatus of claim 1, wherein the degeneration inductor is coupled between a source terminal of the PMOS transistor and the supply voltage.

6. The apparatus of claim 1, wherein the one or more second protection diodes are further configured to limit a voltage difference between a gate terminal of the PMOS transistor and a drain terminal of the PMOS transistor.

7. The apparatus of claim 1, wherein the one or more second protection diodes are coupled between a gate terminal of the PMOS transistor and a drain terminal of the PMOS transistor.

8. The apparatus of claim 1, further comprising:
one or more primary protection diodes configured to limit a voltage difference between ground and the supply voltage when the voltage difference between ground and the supply voltage exceeds a first threshold voltage; and
a clamp circuit configured to limit a voltage difference between the supply voltage and ground when the voltage difference between the supply voltage and ground exceeds a second threshold voltage.

9. The apparatus of claim 1, further comprising:

an NMOS transistor, configured to generate the output signal of the amplifier based on the input signal, wherein the amplifier is a CMOS amplifier.

10. The apparatus of claim 9, further comprising:
a third protection diode configured to limit a voltage difference between the input terminal of the amplifier and a source terminal of the NMOS transistor.

11. A apparatus comprising:
means for amplifying an input signal and generating an output signal of an amplifier via a PMOS transistor;
means for reducing a gain of the amplifier;
means for limiting a voltage difference between an input terminal of the amplifier and a supply voltage, wherein the means for limiting are directly coupled between a gate terminal and a source terminal of the PMOS transistor; and
means for limiting a voltage difference between the input terminal and an output terminal of the amplifier, the means for limiting directly coupled between the gate terminal and a drain terminal of the PMOS transistor.

12. The apparatus of claim 11, wherein the means for limiting the voltage difference between the input terminal of the amplifier and the supply voltage is to also limit a voltage difference between a gate terminal and a source terminal of the PMOS transistor.

13. The apparatus of claim 11, further comprising:
means for limiting a voltage difference between ground and the supply voltage when the voltage difference between ground and the supply voltage exceeds a first threshold voltage; and
means for limiting a voltage difference between the supply voltage and ground when the voltage difference between the supply voltage and ground exceeds a second threshold voltage.

14. The apparatus of claim 11, wherein the means for amplifying the input signal and generating the output signal of the amplifier is to limit a voltage difference between the input terminal of the amplifier and a source terminal of an NMOS transistor, and wherein the amplifier is a CMOS amplifier.

15. A method comprising:
amplifying, by a PMOS transistor, an input signal and generating an output signal of an amplifier;
reducing, by an inductor, a gain of the amplifier;
limiting, by a first protection diode, a voltage difference between an input terminal of the amplifier and a supply voltage, wherein the first protection diode is directly coupled between a source terminal of the PMOS transistor and a gate terminal of the PMOS transistor; and
limiting, by one or more second protection diodes, a voltage difference between the input terminal and an output terminal of the PMOS transistor, the one or more second protection diodes directly coupled between the gate terminal and a drain of the PMOS transistor.

16. The method of claim 15, wherein limiting the voltage difference between the input terminal of the amplifier and the supply voltage comprises:
limiting a voltage difference between a gate terminal and a source terminal of the PMOS transistor.

17. The apparatus of claim 1, wherein the one or more second protection diodes comprise:
two series coupled diodes; and
a third diode coupled in series to a second resistor, wherein the third diode and the second resistor are directly coupled in parallel to the series coupled diodes.

18. The apparatus of claim 11, wherein the means for limiting is to:
limit the voltage difference between the output terminal and the input terminal of the amplifier via two series coupled diodes; and
limit the voltage difference between the input terminal and the output terminal of the amplifier via a third diode coupled in series to a resistor, wherein the third diode and the resistor are directly coupled in parallel to the series coupled diodes.

19. The method of claim 15, wherein the one or more second protection diodes comprise:
two series coupled diodes; and
a third diode coupled in series to a resistor, wherein the third diode and the resistor are directly coupled in parallel to the series coupled diodes.

* * * * *